United States Patent [19]

Matsubara

[11] Patent Number: 5,569,618
[45] Date of Patent: Oct. 29, 1996

[54] METHOD FOR PLANARIZING INSULATING FILM

[75] Inventor: Yoshihisa Matsubara, Tokyo, Japan

[73] Assignee: NEC Corporation, Tokyo, Japan

[21] Appl. No.: 25,389

[22] Filed: Mar. 2, 1993

[30] Foreign Application Priority Data

Mar. 3, 1992 [JP] Japan ................................. 4-045093

[51] Int. Cl.$^6$ .............................................. H01L 21/8242
[52] U.S. Cl. ............................ 437/52; 437/60; 437/195; 437/228; 437/231
[58] Field of Search ................................... 437/235, 238, 437/978, 195, 60, 228 PL, 52; 148/DIG. 43, DIG. 81

[56] References Cited

U.S. PATENT DOCUMENTS

| | | | |
|---|---|---|---|
| 4,446,194 | 5/1984 | Candelaria et al. | 428/428 |
| 4,986,878 | 1/1991 | Malazgirt et al. | 156/643 |
| 5,089,442 | 2/1992 | Olmer | 432/245 |
| 5,212,114 | 5/1993 | Grewal et al. | 437/192 |
| 5,217,914 | 6/1993 | Matsumoto et al. | 437/47 |
| 5,294,294 | 3/1994 | Namose | 156/643 |
| 5,314,845 | 5/1994 | Lee et al. | 437/238 |
| 5,316,980 | 5/1994 | Takeshiro | 437/228 |
| 5,319,247 | 6/1994 | Matsuura | 257/760 |
| 5,332,694 | 7/1994 | Suzuki | 437/195 |

FOREIGN PATENT DOCUMENTS

| | | | |
|---|---|---|---|
| 60-142544A | 7/1985 | Japan | 437/195 |
| 273652A | 3/1990 | Japan | 437/978 |
| 4-167429A | 10/1990 | Japan | 437/978 |

OTHER PUBLICATIONS

Wolf, "Silicon Processing for the VCSI Era", vol. II, pp. 194–195, 222–224, 273, 615 ©1990.

Takata, Y., et al., "A Highly Reliable Multilevel Interconnection Process For 0.6μm CMOS Devices," VMIC Conference, Jun. 11–12, 1991, pp. 13–19.

Morimoto, S., and Grant, S.Q., "Manufacturable and Reliable Spin–On–Glass Planarization Process for 1 μm CMOS Double Layer Metal Technology," pp. 411–417 (Date Unknown).

Primary Examiner—Mary Wilczewski
Assistant Examiner—Richard A. Booth
Attorney, Agent, or Firm—Popham, Haik, Schnobrich & Kaufman, Ltd.

[57] ABSTRACT

A method for manufacturing a semiconductor device is disclosed in which an insulating film is formed on a semiconductor substrate, elements are formed on the insulating film, the first oxide film is formed on the surface of the insulating film in the elements using plasma-enhanced chemical vapor deposition, a second oxide film is formed on the surface of the first oxide film using atmospheric-pressure chemical vapor deposition, a third oxide film is formed on the surface of the second oxide film using plasma-enhanced chemical vapor deposition, and organic spin-on-glass film is formed on the surface of the third oxide film, and etched back is performed until the organic spin-on-glass film is removed.

9 Claims, 6 Drawing Sheets

METHOD FOR PLANARIZING INSULATING FILM

BACKGROUND OF THE INVENTION

The present invention relates to a method for fabricating a semiconductor device, and more particularly to a method for planarizing insulating films.

A multi-level interconnection structure is required in a highly integrated circuit. Planarization of an inter-layer insulating film used in the structure comes to be important. In the past, it is known that a spin-on-glass is used to planarize the inter-layer insulating film. For example, first, low-level wirings are formed on a surface of a substrate. Then, a first insulating film is formed on the surface of the wirings and the substrate. Existence of the wirings is reflected in uneven surface of the first insulating film. Then, a spin-on-glass film is formed on the first insulating film to planarize the uneven surface of the first insulating film. Then, a second insulating film is formed on the spin-on-glass film. Then, upper-level wirings are formed on the second insulating film. Through these processes, a two-level interconnection structure having improved plane surface of inter-layer insulating film is complicated. However, evenness cannot coexist with reliability of the insulating films.

SUMMARY OF THE INVENTION

Therefore, it is an object of the present invention to provide a method for manufacturing a semiconductor device having improved reliability and evenness.

This invention provides a method for fabricating a semiconductor device in which an insulating film is formed on a semiconductor substrate, elements are formed on the insulating film, a first oxide film is formed on the surface of the insulating film and the elements using plasma-enhanced chemical vapor deposition, a second oxide film is formed on the surface of the first oxide film using atmospheric-pressure chemical vapor deposition, a third oxide film is formed on the surface of the second oxide film using plasma-enhanced chemical vapor deposition, an organic spin-on-glass film is formed on the surface of the third oxide film, and etch back is performed until removal of the organic spin-on-glass film.

According to the present invention, the organic spin-on-glass film can be removed completely by depositing more than three layers of silicon oxide film using plasma-enhanced chemical vapor deposition and forming silicon oxide film using atmospheric-pressure chemical vapor deposition, alternately. Therefore, highly reliable inter-layer insulating film can be formed, as evenness can coexists with yield of through hole.

BRIEF DESCRIPTION OF THE DRAWINGS

The above-mentioned and other objects, features and advantages of the invention will become more apparent by reference to the following detailed description of the invention taken in conjunction with the accompanying drawings, wherein.

DETAILED DESCRIPTION OF THE PREFERRED EMBODIMENTS

Prior to description of the embodiments, conventional art will be explained more in detail.

Figure 1A:
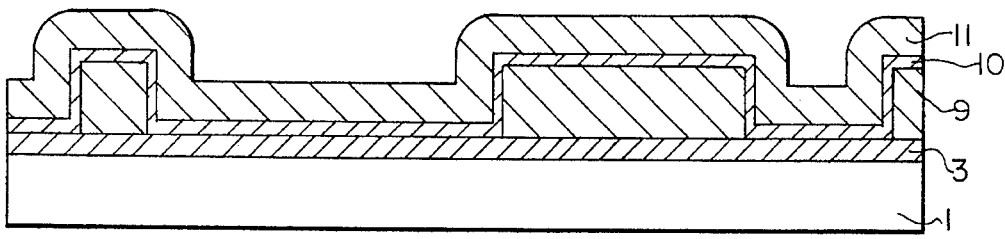
FIGS. 1(a) to (d) show sectional views of the semiconductor device for explaining a prior art device.
Figure 1B:
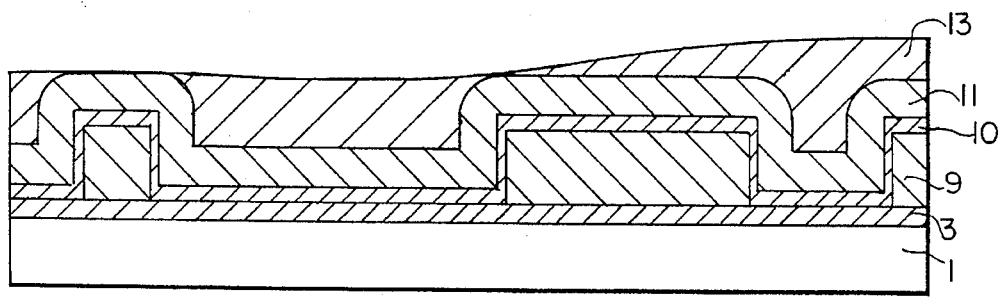
Figure 1C:
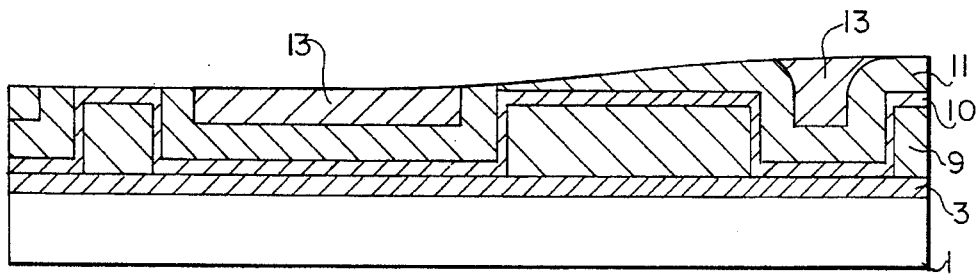
Figure 1D:
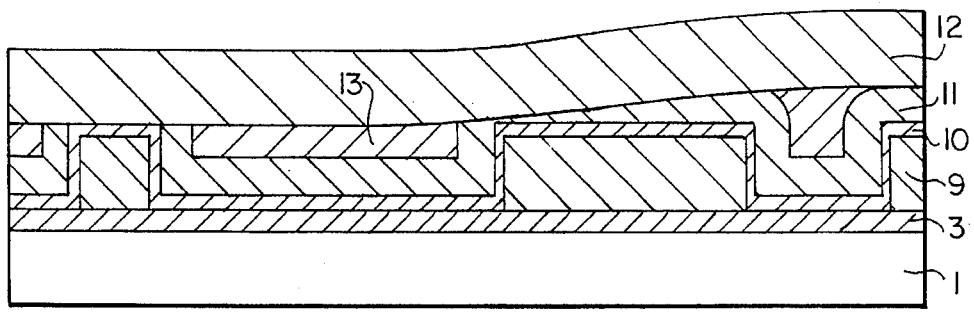
Figure 5:
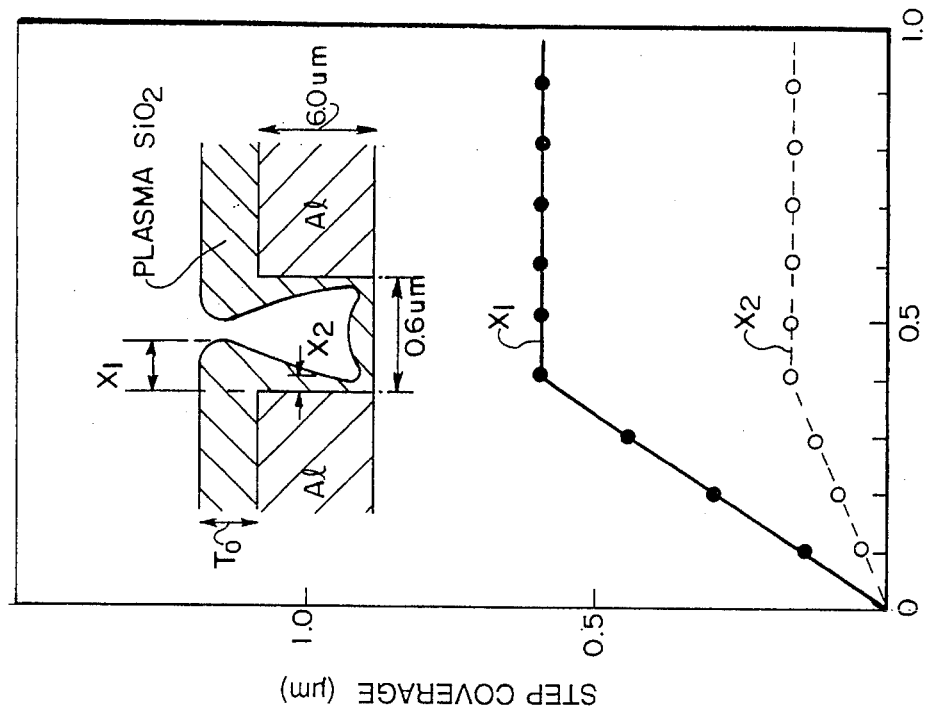
FIG. 5 is a graph showing a relationship between thickness of the silicon oxide film made by plasma-enhanced CVD and step coverage.
Figure 4:
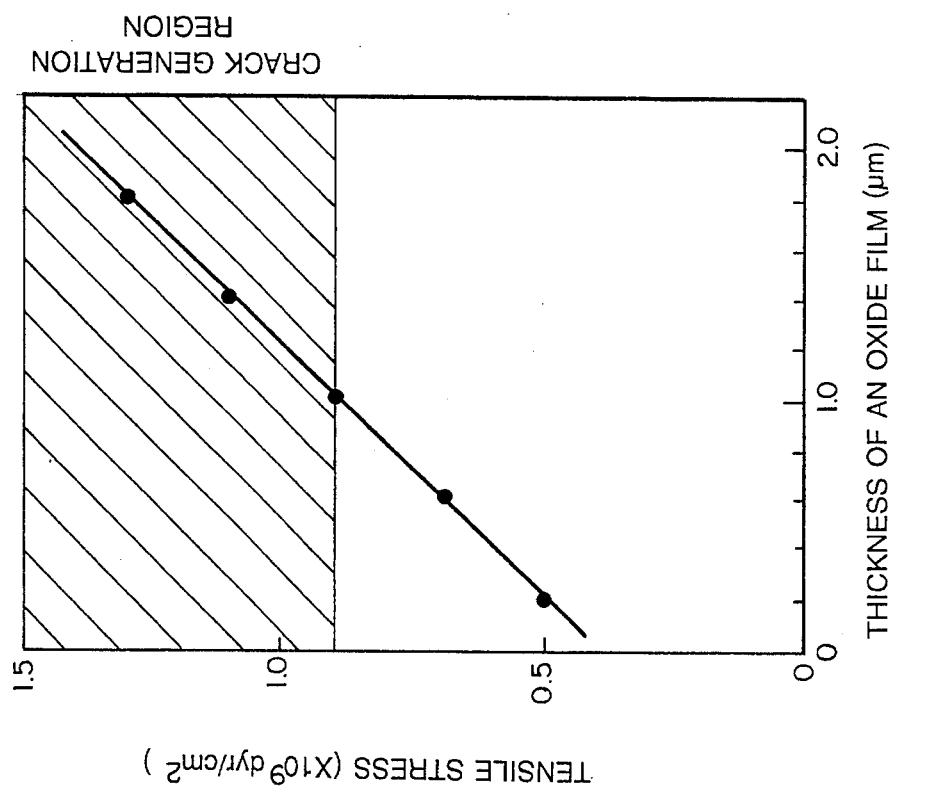
FIG. 4 is a graph showing a relationship between thickness of oxide film and tensile stress.
Figure 6A:
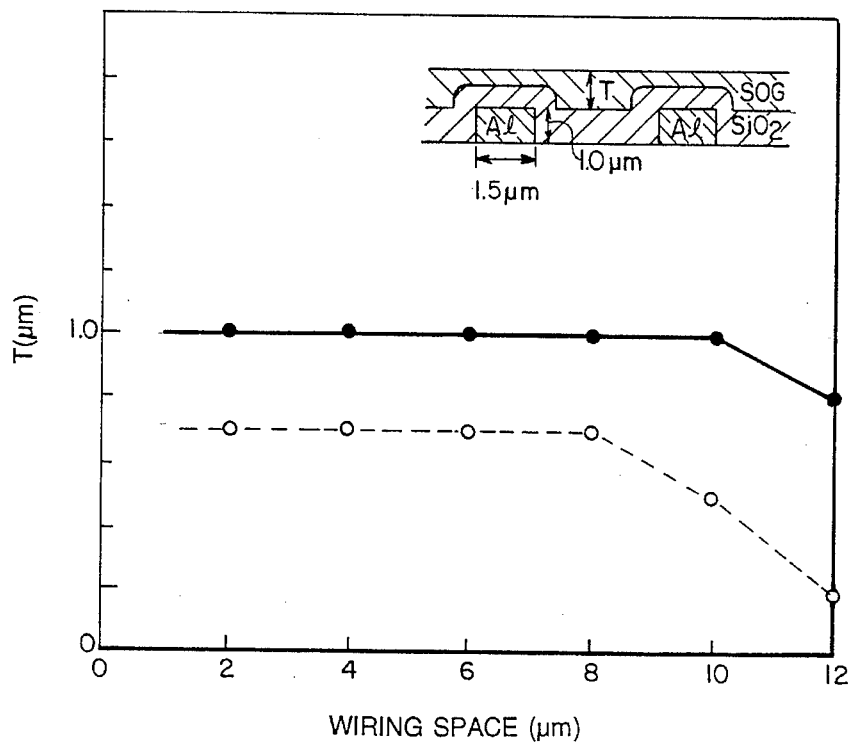
FIG. 6(a) is a graph showing dependence of space of the wiring layers on thickness of the SOG film formed between the wiring layers.

As shown in FIG. 1(a), a thermal oxide film 3 having a thickness of 0.5 μm is formed on a semiconductor substrate 1. Then, aluminum alloy with thickness of 1.0 μm is formed on the oxide film 3. Then, a resist pattern is formed on the aluminum alloy. Then, low-level aluminum wiring layers 9 are formed by etching the aluminum alloy with the resist as an etching mask. Then, the mask is removed. Next, a first silicon oxide film 10 is deposited on an entire exposed surface of the oxide film 3 and the wiring layers 9 using a plasma-enhanced chemical vapor deposition method. The chemical vapor deposition method is abbreviated to the CVD method. Then, a second silicon oxide film 11 is deposited on the first silicon oxide film 10 by atmospheric-pressure CVD method, applying tetraethoxysilane and oxygen comprising ozone as source gas. Then, as shown in FIG. 1(b), organic spin-on-glass solution comprising methylsilanol ($CH_3$-$Si(OH)_3$) as main component is spin-coated. The spin-on-glass is abbreviated to the SOG. Then, heat treatment is performed in $N_2$ atmosphere at 400° C. Next, as shown in FIG. 1(c), an organic SOG film 13 and the second silicon oxide film 11 is etched back with paying attention not to expose the low-level aluminum wiring layer 9. At this time, potions of the SOG film 13 is remained between the low-level aluminum wiring layers 9. Then, as Shown in FIG. 1(d), another insulating film 12 is deposited using plasma-enhanced CVD to supplement the insulating films 10, 11 and 13. In the conventional art described above, the organic SOG film remains between the insulating films. The remained SOG film worsens electric characteristic of through hole, because the film generates gas by receiving stress and annealing in the succeeding fabrication steps. Moreover, the generated gas inflates the insulating films, and makes cracks in the insulating films. In order to remove the organic SOG film completely, silicon oxide film having thickness more than the total thickness of the low-level aluminum wiring layer 9 and the organic SOG film 13 must be deposited and etched back. However, oxide film deposited using atmospheric-pressure CVD applying tetraethoxysilane and oxygen comprising ozone as source gas has a large tensile-stress characteristic. As shown in FIG. 4, crack is generated when the thickness of the deposited film is more than 1.0 μm. Accordingly, considering the crack tolerance to the tensile stress, the thickness of the silicon oxide film deposited using atmospheric-pressure CVD applying tetraethoxysilane and oxygen comprising ozone as source gas is limited less than 1.0 μm. Because the silicon oxide film with thickness more than 2 μm performs compressive stress, the crack tolerance is large. However, step coverage shape is very poor comparing to silicon oxide film formed by atmospheric-pressure CVD method. FIG. 4 shows step coverage of the silicon oxide film deposited by plasma-enhanced CVD method. In this case, aluminum wiring layers with thickness of 1.0 μm are located with keeping a space of 0.6 μm each other. At an opening part, the thickness x1 of the deposited film is close to the thickness To of the deposited film at the plane part. However, the thickness x2 of it at a valley part is about ⅓ of the thickness x1. When the film with thickness more than 0.4 μm is deposited, a void is formed in the center of the opening. Consequently, in case of two layer structure composed of silicon oxide films deposited by plasma-enhanced CVD and atmospheric-pressure CVD, silicon oxide film with thickness more than 1.4 μm (=0.4+1.0) cannot deposited. On the other hand, evenness is determined thickness of the SOG film deposited between aluminum wiring layers. FIG. 6(a) shows a relationship between space between aluminum wiring layers ( valley part ) and thickness of the SOG film deposited between the aluminum wiring layers. FIG. 5(b) shows evenness of the insulating film after etch back. In case that the thickness T of the SOG film deposited at the valley part is less than 0.3 μm and is less than the thickness of the aluminum wiring layer, complete evenness cannot be obtained. When the thickness of the organic SOG film which determines the evenness is selected more than 0.5 μm, aluminum wiring layer with wiring space less than 10 μm and thickness of 1.0 μm can be planarized. Therefore, in the conventional art, when the thickness of the organic SOG film is made thin less than 0.5 μm, the organic SOG film can be removed and yield of the through hole can be improved. However, it results decrease in evenness, short-circuit between aluminum layers and decrease in reliability. To the contrary, when the thickness is made thick, evenness can be ameliorated. However, when the etch back is carried out, the organic SOG film cannot be removed completely. It results that the yield of the through hole gets worse. As described above, in the conventional method, evenness cannot coexist with high yield of the through hole.

Figure 2A:
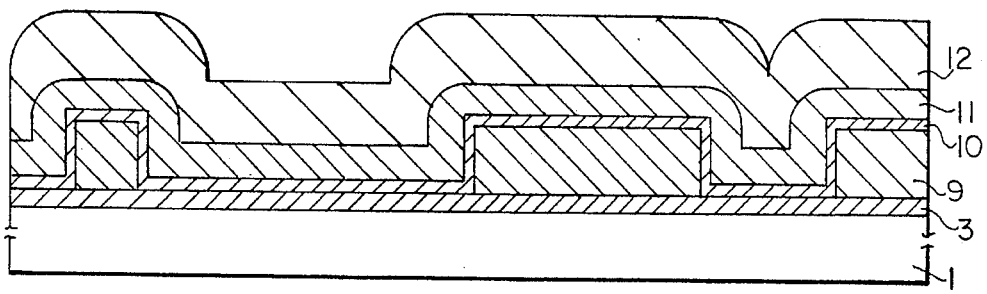
FIGS. 2(a) to (d) show sectional views of the semiconductor device for explaining a first embodiment of the present invention.
Figure 2B:
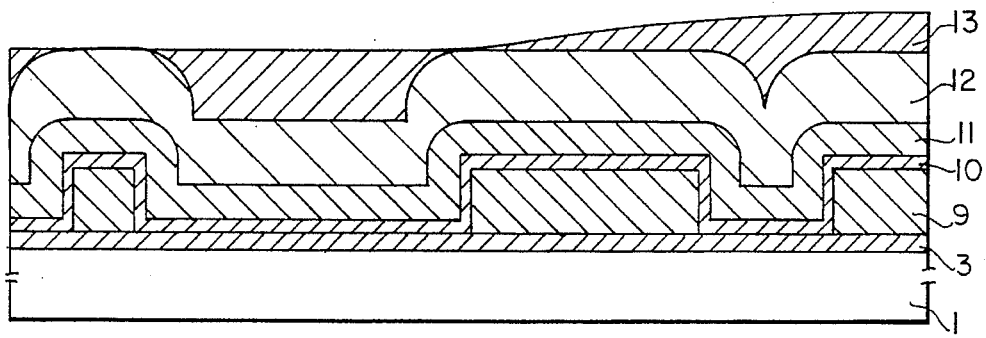
Figure 2C:
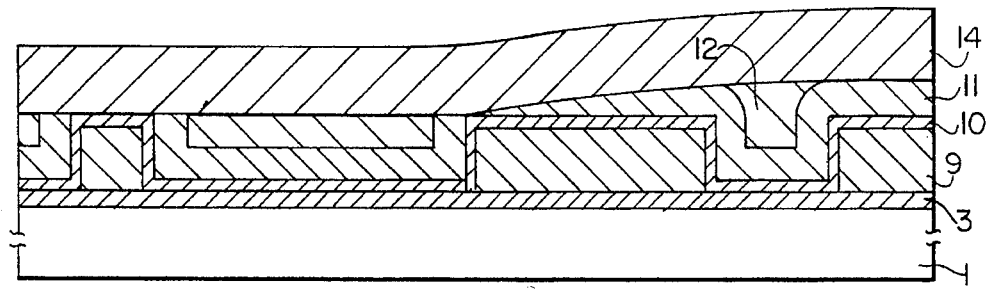
Figure 2D:
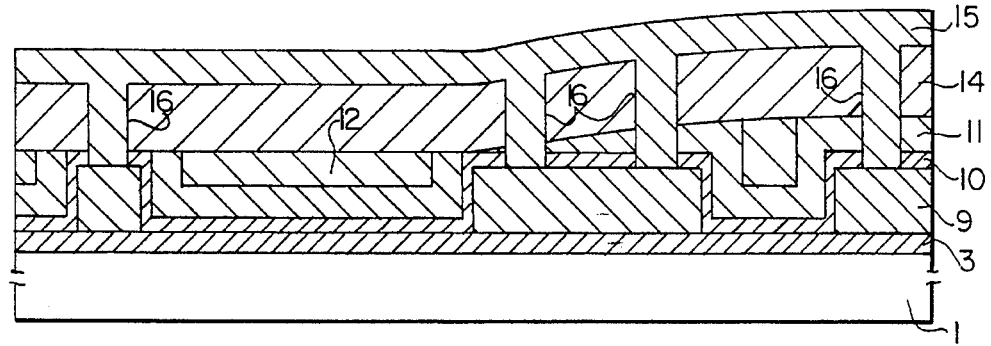
Figure 6B:
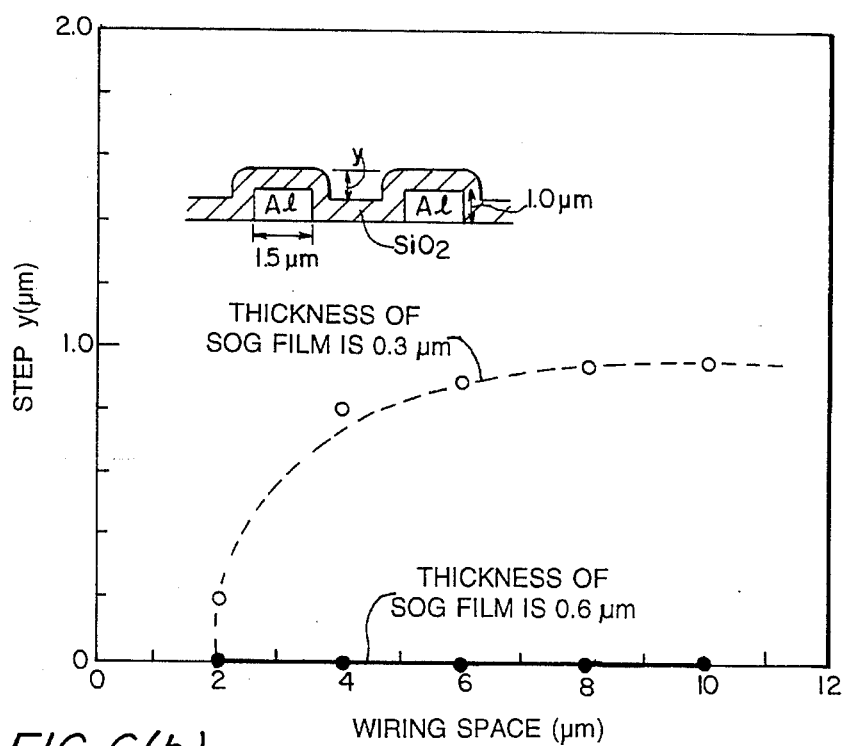
FIG. 6(b) is a graph showing dependence of space of the wiring layers on step of the inter-layer insulating film.
Figure 8:
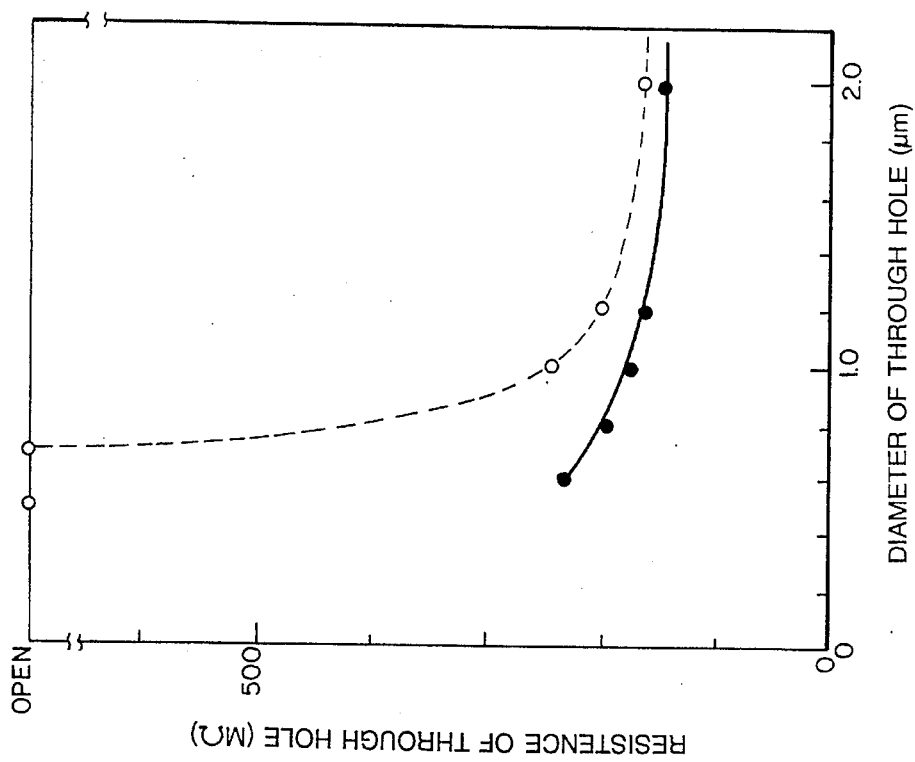
FIG. 8 is a graph showing a relationship between a diameter of a through hole and a resistance of the through hole.
Figure 7:
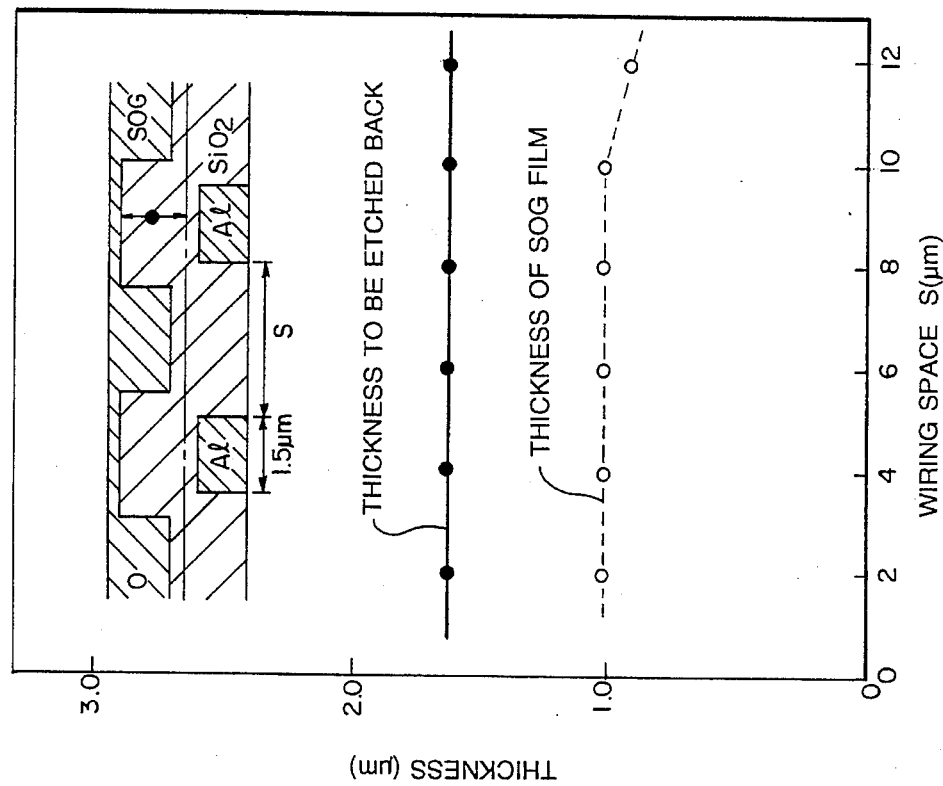
FIG. 7 is a graph showing a relationship between space of the wiring layers and thickness of the SOG film, and thickness of the insulating film to be etch back, respectively.

Turning to FIG. 2(a), according to a first embodiment of the present invention, a silicon oxide film 3 formed by thermal oxidization method with thickness of 0.5 μm is formed on a silicon substrate 1. Then, aluminum alloy is sputtered on the oxide film 3. Then, a resist pattern is formed on the aluminum alloy. Then, low-level aluminum wiring layers 9 are formed by etching the aluminum alloy with the resist as an etching mask. Then, the mask is removed. Then, a first silicon oxide film 10 having a thickness of 0.4 μm is deposited on an entire exposed surface of the oxide film 3 and the wiring layers 9 using plasma-enhanced CVD method. Then, a second silicon oxide film 11 is deposited on the first silicon oxide film 10 by atmospheric-pressure CVD method. Tetraethoxysilane (Si (OC$_2$H$_5$)$_4$) and oxygen comprising ozone are employed as the source gas. Phosphorus or boron may be doped in the silicon oxide film 11. Then, a third silicon oxide film 12 having a thickness of 0.8 μm is deposited on the silicon oxide films. Next, as shown in FIG. 2(b), and organic SOG solution comprising methylsilanol (CH$_3$-Si(OH)$_3$) as main component is spin-coated with revolution speed of 2500 rpm. Then, an organic SOG film 13 is formed using heat treatment in and N$_2$ atmosphere at 300° C. for 30 minutes. Then, the organic SOG film 13 and the silicon film 12 of thickness 1.6 μm are etched back using a dry etching method introducing methane trifluoride (CHF$_3$) as the etching gas. In the dry etching method, etching speed ratio of the organic SOG film to the oxide film 12 is determined as 1:1. In case that etching is performed in order to remain the first silicon oxide film 10 which is formed on the low-level aluminum wiring layer 9 separated from nearest pattern more than 10 μm. Then, oxygen plasma treatment is carried out to remove a polymer deposited at the etching back process. The polymer is generated by reaction between the methane trifluoride and the organic SOG film. Then, through holes 16 are formed, and an upper-level wiring layer 15 is formed to connect to low-level wiring layers via through holes 16. Accordingly, desired multi-level wiring is complicated. In the present embodiment, complete planarization is realized applying the organic SOG film with thickness of 0.6 μm. As shown in FIG. 6(b), step of interlayer insulating film y is zero μm against wiring step with wiring space less than 10 μm. The organic SOG film is completely removed with etching back a silicon oxide film with 1.6 μm greater than the thickness of 1.0 μm deposited between wiring shown in FIG. 6(a). FIG. 7 shows relationship between wiring space and thickness of the organic SOG film deposited among wiring (O), and thickness of the etched-back oxide film ( ● ). In the figure, the thickness of the oxide film ( ● ) is larger than the thickness of the organic SOG film (O) in case of wiring space of 2 μm. As shown in FIG. 7, the organic SOG film 13 shown in FIG. 1(c) is removed perfectly. As shown in FIG. 8, in the conventional art, open failure is generated because of remaining the organic SOG film near the through holes. To the contrary, According to the present embodiment, the organic SOG film can be removed completely. Therefore, evenness is coexisted with high yield of through hole. Inter-layer having excellent reliability can be formed.

Figure 3A:
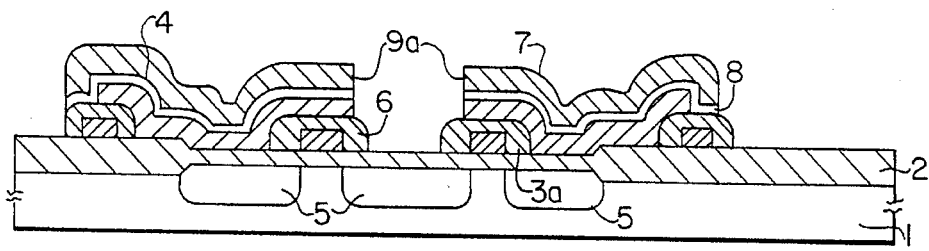
FIGS. 3(a) to (d) show sectional views of the semiconductor device for explaining a second embodiment of the present invention.
Figure 3B:
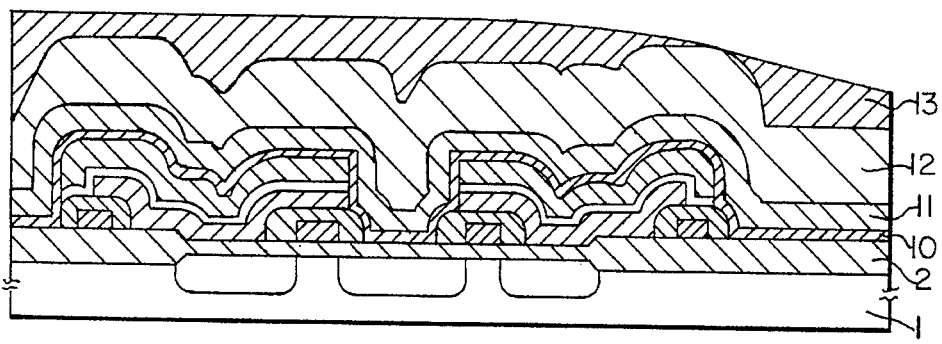
Figure 3C:
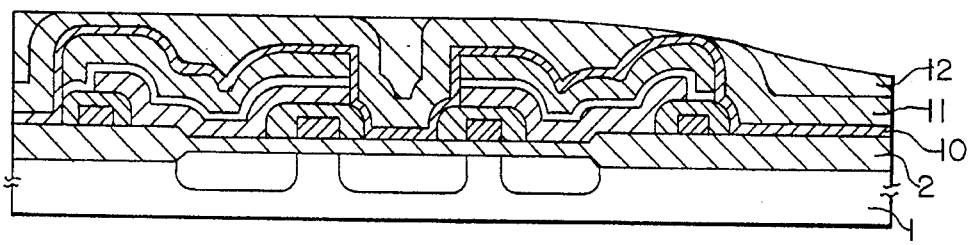
Figure 3D:
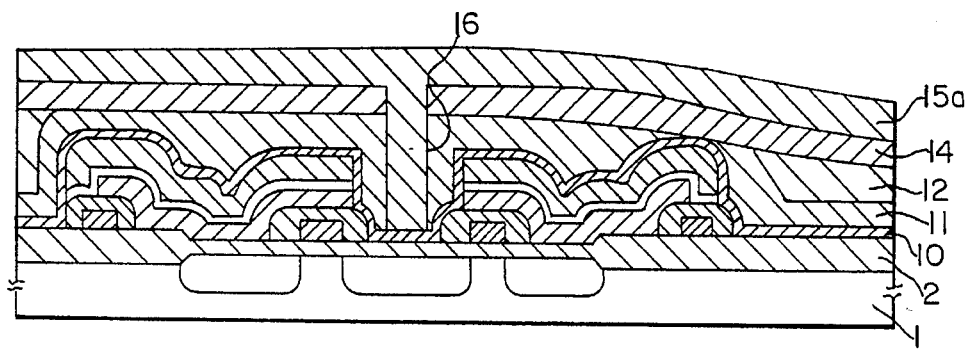

Next, a method for fabricating a dynamic random access memory having stacked capacitors is described as a second embodiment of the invention. First, as shown in FIG. 3(a), field oxide film 2 for device isolation is formed on a P type semiconductor substrate 1 using selective oxidization method. Then, gate oxide film 3a, gate electrode 4 serving as word line and N type diffusion layers 5 serving as source/drain region are formed in order. Then, storage node 7 made of doped poly crystalline silicon serving as bottom electrode of a capacitor is formed, followed by forming an inter-layer insulating film 6. Then, an insulating film 8 is formed on the storage node 7. Then, cell plate 9a made of aluminum alloy serving as an upper electrode of capacitor is formed. Capacitance is formed between the storage node 7 and cell plate 9a. Next, as shown in FIG. 3(b), a first silicon oxide film 10 having thickness of 0.4 μm is deposited using plasma-enhanced CVD method. Then, a second silicon oxide film 11 having thickness of 0.8 μm is formed using atmospheric-pressure CVD method. Oxygen comprising ozone and tetraethoxysilane are employed as source gas. Then, a third silicon oxide film 12 having thickness of 0.8 μm is formed on the second silicon oxide film 12. Then, organic SOG solution comprising methylsilanol (CH$_3$-Si(OH)$_3$) as main component is spin-coated with revolution speed of 2500 rpm. Then, an organic SOG film 13 having thickness of 0.6 μm is formed using heat treatment in N$_2$ atmosphere at 350° C. for 30 minutes. Next, as shown in FIG. 3(c), both the organic SOG film 13 and the third silicon oxide film 12 are etched back with avoiding the upper electrode 9a exposing. Then, oxygen plasma treatment is carried out to remove a polymer deposited at the etch back process. The polymer is made by reaction between methane trifluoride and the organic SOG. Next, as shown in FIG. 3(d), a fourth silicon oxide film 14 having thickness of 0.4 µm is deposited. Then, through hole 16 is opened, followed by forming resist film as an etching mask on the fourth silicon oxide film 14. After removal of the resist, bit line 15a made of aluminum alloy is formed, dynamic random memory cell part is complicated.

Although the invention has been described with reference to specific embodiments, this description is not meant to be construed in a limited sense. Various modifications of the disclosed embodiments, as well as other embodiments of the invention, will become apparent to persons skilled in the art upon reference to the description of the invention. It is therefore contemplated that appended claims will cover any modifications or embodiments as fall within the scope of the invention.

What is claimed is:

1. A method for fabricating a semiconductor device, comprising:

forming an insulating film on a semiconductor substrate;

forming capacitor cells for a semiconductor memory device on said insulating film;

forming a first oxide film over said insulating film and said capacitor cells using plasma-enhanced chemical vapor deposition;

forming a second oxide film over said first oxide film using atmospheric-pressure chemical vapor deposition said second oxide film having an upper surface;

forming a third oxide film directly atop the entire upper surface of said second oxide film using plasma-enhanced chemical vapor deposition;

forming an organic spin-on-glass film on said third oxide film; and performing etchback until said organic spin-on-glass film is removed.

2. The method for fabricating a semiconductor device as claimed in claim 1, further comprising the step of forming a fourth oxide film after performing etch back until said organic spin-on-glass film is removed.

3. The method for fabricating a semiconductor device as claimed in claim 2, further comprising the step of forming a through hole in said first, said second said third and said fourth oxide films.

4. A method for fabricating a dynamic random access semiconductor device having stacked capacitors, the method comprising:

forming a field oxide film on a semiconductor substrate;

forming a gate oxide film, a gate electrode which serves as a word line and a diffusion layer which serves as a source/drain region;

forming a storage node of doped polycrystalline silicon for the bottom electrode of a capacitor;

forming an insulating film over the storage node;

forming a cell plate serving as an upper electrode of said capacitor over said storage node;

depositing a first silicon oxide film using a plasma-enhanced chemical vapor deposition method;

forming a second silicon oxide film over said first silicon oxide film using an atmospheric-pressure chemical vapor deposition method said second silicon oxide film having an upper surface;

forming a third silicon oxide film directly atop the entire upper surface of said second silicon oxide film;

forming an organic spin-on-glass film on said third silicon oxide film;

etching back both the organic spin-on-glass film and the third silicon oxide film;

depositing a fourth silicon oxide film;

creating a through hole through said first, second, third, and fourth silicon oxide films; and forming a bit line extending into said through hole.

5. A method for fabricating a semiconductor device, comprising:

forming a plurality of wiring layers on an insulator layer covering a semiconductor substrate, said wiring layers forming gaps thereamong and each of said wiring layers having a first thickness;

forming a first interlayer insulating film on said insulator film and said wiring layer in a second thickness that is larger than said first thickness, said first interlayer insulating film thereby completely filling said gaps among said wiring layers and said first interlayer insulating film including at least a first insulating film, a second insulating film having an upper surface and deposited on said first insulating film and a third insulating film deposited on the entire upper surface of said second insulating film, said first insulating film being made of silicon oxide and deposited by plasma-enhanced chemical vapor deposition, said second insulating film being made of silicon oxide and deposited by atmospheric-pressure chemical vapor deposition and said third insulating film being made of silicon oxide and deposited by said plasma-enhanced chemical vapor deposition;

coating an organic spin-on-glass film on said first interlayer insulating film to absorb an unevenness of a surface of said first interlayer insulating film, said organic spin-on-glass film thereby having a substantially even surface;

performing an etch-back process by dry etching until said organic spin-on-glass film is completely removed to thereby make the surface of said first interlayer insulating film even; and depositing a second silicon interlayer insulating film on said first interlayer insulating film.

6. The method as claimed in claim 5, wherein each of said first and third insulating films is deposited in a thickness less than 0.4 µm and said second insulating film is deposited in a thickness less than 1.0 µm.

7. The method as claimed in claim 6, wherein said second insulating film is doped with at least one of phosphorous and boron.

8. A method for fabricating a semiconductor device, comprising:

forming first and second wiring layers on a first insulating film covering a semiconductor substrate, said first and second wiring layers being formed apart from each other to provide a gap therebetween and each of said first and second wiring layers having a first thickness;

depositing a first silicon oxide film by plasma-enhanced chemical vapor deposition to cover said first insulating film and said first and second wiring layers;

depositing a second silicon oxide film by atmospheric-pressure chemical vapor deposition on said first silicon oxide film said second silicon oxide film having an upper surface;

depositing a third silicon oxide film by said plasma-enhanced chemical vapor deposition on the entire upper surface of said second silicon oxide film, said first, second and third silicon oxide films thereby cooperating with one another to completely fill said gap between said first and second wiring layers;

coating a spin-on-glass film on said third silicon oxide film so as to have a substantially even surface; and performing an etch-back process by dry etching until said spin-on-glass film is completely removed.

9. The method for fabricating a semiconductor device as claimed in claim 5, further comprising the step of forming a through hole in said first, said second and said third insulating films to expose a surface of said wiring layer.

* * * * *